(12) United States Patent
Eytan et al.

(10) Patent No.: US 8,804,299 B2
(45) Date of Patent: Aug. 12, 2014

(54) ELECTROSTATIC CHUCK AND A METHOD FOR SUPPORTING A WAFER

(75) Inventors: Guy Eytan, Kidron (IL); Shmuel Shmulik Nakash, Nes-Ziona (IL); Konstantin Chirko, Rehovot (IL)

(73) Assignee: Applied Materials Israel, Ltd., Rehovot (IL)

( * ) Notice: Subject to any disclaimer, the term of this patent is extended or adjusted under 35 U.S.C. 154(b) by 88 days.

(21) Appl. No.: 13/371,909

(22) Filed: Feb. 13, 2012

(65) Prior Publication Data

US 2012/0262834 A1 Oct. 18, 2012

Related U.S. Application Data

(60) Provisional application No. 61/442,783, filed on Feb. 14, 2011.

(51) Int. Cl.
*H01T 23/00* (2006.01)

(52) U.S. Cl.
USPC .......................................... 361/234; 361/230

(58) Field of Classification Search
USPC .................................................. 361/234, 230
See application file for complete search history.

(56) References Cited

U.S. PATENT DOCUMENTS

2006/0158823 A1* 7/2006 Mizuno et al. ................. 361/234

FOREIGN PATENT DOCUMENTS

DE 292119 A * 7/1991

* cited by examiner

*Primary Examiner* — Danny Nguyen
(74) *Attorney, Agent, or Firm* — Kilpatrick Townsend & Stockton LLP (57) ABSTRACT

An electrostatic chuck includes an isolating substrate that surrounds at least one electrode; multiple protrusions having upper portions arranged to contact a wafer; and at least one discharging element positioned between the at least one electrode and the upper portions of the multiple protrusions; which discharging element, once coupled to a discharging circuit, is arranged to discharge charge accumulated in the isolating substrate.

21 Claims, 10 Drawing Sheets

ELECTROSTATIC CHUCK AND A METHOD FOR SUPPORTING A WAFER

RELATED APPLICATIONS

The present application is a NONPROVISIONAL of, claims priority to and incorporates by reference U.S. Provisional Application No. 61/442,783, filed 14 Feb. 2011.

FIELD OF THE INVENTION

The present invention relates to an electrostatic chuck, and in particular to such a chuck as employs a discharging element for discharging charge accumulated in a substrate.

BACKGROUND

Scanning electron microscopes and electric beam inspection devices use an electrostatic chuck (ESC) to support wafers that are located within a vacuumed chamber.

Figure 1:
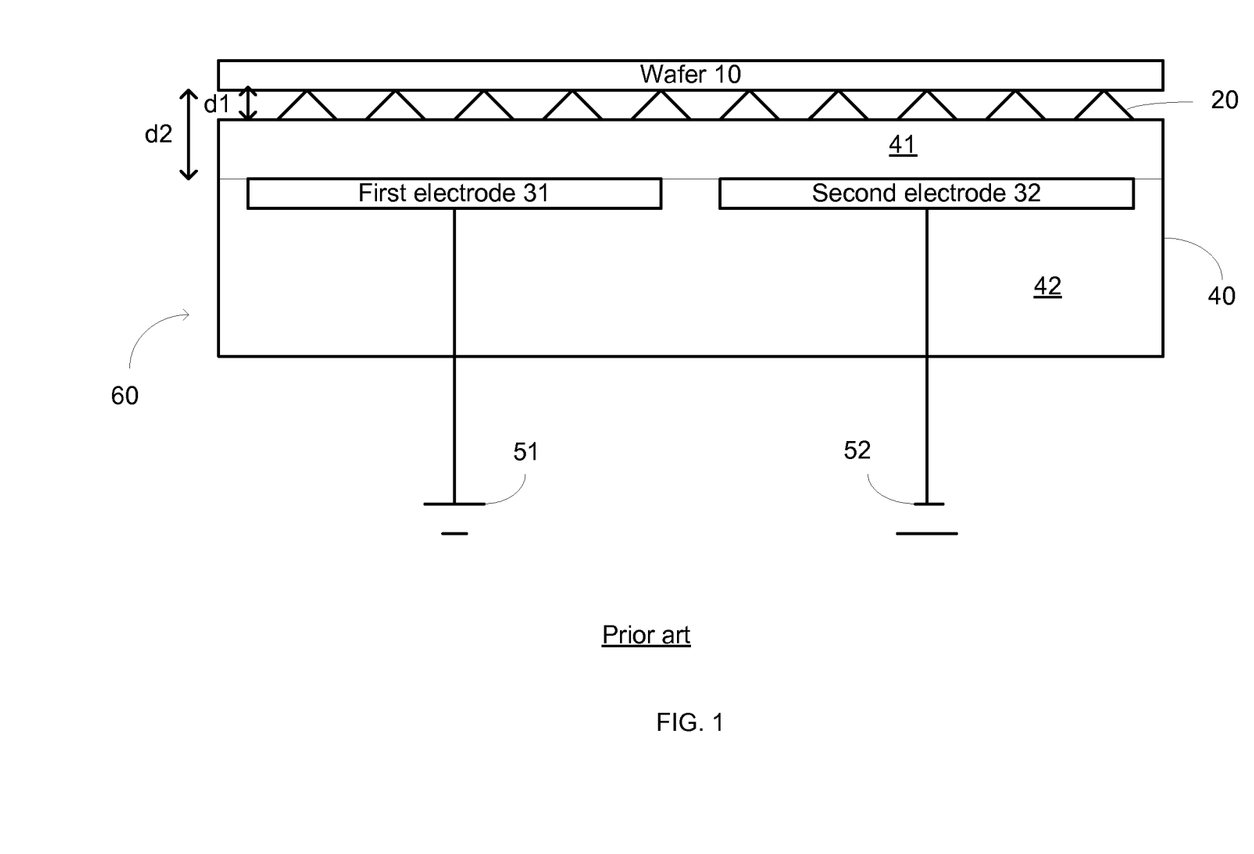
FIG. 1 illustrates a wafer and a conventional electrostatic chuck.

FIG. 1 illustrates a conventional chuck 60 and a wafer 10. Chuck 60 includes an isolating substrate 40, two electrodes 31 and 32 that are connected to two voltage suppliers 51 and 52, and multiple microscopic protrusions 20 that contact the wafer 10.

The chuck 60 also has one or more grounding elements (not shown) for connecting the wafer 10 to electrical ground (zero potential).

The isolating substrate 40 is made of isolating materials such as ceramics (including alumina).

The two electrodes 31 and 32 are located within the isolating substrate 40 and are surrounded by isolating material. In some cases (as illustrated in FIG. 1) an upper portion 41 of the isolating substrate 40 is made of different material than a lower portion 42 of the isolating substrate 40. The electrodes 31 and 32 may virtually separate the isolating substrate 40 to the upper portion 41 and to the lower portion 42.

Typically, one electrode 31 is connected to a positive potential (51) and the other electrode 32 is connected to a negative potential (52).

The voltage differences between the wafer 10 and each of the electrodes 31 and 32 attract the wafer 10 towards the chuck 60.

It is noted that this figure (as well as the other figures of this application) are not to scale. For example, while FIG. 1 illustrates distance d2 as being about five times bigger than distance d1, the actual ratio of d1:d2 may exceed fifty. The distance d1 between the lower surface of the wafer 10 and the upper surface of the insulating substrate 40 may be approximately 3-4 microns, while distance d2 between the lower surface of the wafer 10 and the electrodes 31 and 32 may be approximately 200 microns.

The isolating substrate 40 is made of isolating material and it accumulates charge. The charge can be developed by migration from the electrodes 31, 32, by touching the wafer 10, or by wafer 10 discharging during unloading. The charge is usually developed in proximity to the upper surface of the isolating substrate 40 and can be concentrated near the edges of the isolating substrate 40.

This charge can damage ESC performance. Residual charge can attract the wafer 10 to the chuck 60 and can prevent the wafer 10 from being easily detached from the electrostatic chuck 60 during an unload process. The charge can even cause the wafer 10 to break during the unload process.

SUMMARY OF THE INVENTION

An electrostatic chuck configured in accordance with one embodiment of the invention includes an isolating substrate that surrounds at least one electrode; multiple protrusions having upper portions arranged to contact a wafer; and at least one discharging element (for example, a sheet) positioned between the at least one electrode and the upper portions of the multiple protrusions. The discharging element, once coupled to a discharging circuit, is arranged to discharge charge accumulated in the isolating substrate. Such a discharging circuit may include at least one switch that is arranged to disconnect discharging element from an electrical ground when operating in a chucking mode and to connect the discharging element to ground when operating in a discharge mode.

The conductivity of the discharging element may be selected to limit electrical discharges between the wafer and the electrostatic chuck. For example, the conductivity of the discharging element may be within a range of 10 mega-ohms per square unit and 10 giga-ohms per square unit. Alternatively, the conductivity of the discharging element may exceed 10 mega-ohms per square unit, or exceed 1 giga-ohms per square unit.

The electrostatic chuck may include a greater number of discharging elements than electrodes. Alternatively, the chuck may include an equal number of discharging elements and electrodes. Or, the chuck may include a fewer number of discharging elements than electrodes.

In some instances, the electrostatic chuck may include a discharging element that is positioned in proximity to an edge of the isolating substrate. Further, in some cases, the discharging element may have an annular shape and be positioned in proximity to an edge of the isolating substrate.

In some embodiments, the chuck may have multiple electrodes and multiple discharging elements. In such cases, the shape of a discharging element may be the same shape as the shape of a respective electrode positioned below it. Alternatively, the shape of each discharging element may be the same shape as the shape of each respective electrode positioned below a subject discharging element. Or, the shape and size of each respective discharging element may be the same shape and size of each respective electrode positioned below a subject discharging element. Of course, in other embodiments the shape of each discharging element may be the same shape as the shape of each respective electrode positioned below a subject discharging element but the size of each discharging element may be larger than the size of each respective electrode that is located below a subject discharging element. In some cases, at least one of the discharging elements may be shaped as a grid.

In some embodiments, no discharging elements are positioned over multiple electrodes that are arranged to be set to different voltage levels. In one particular embodiment, the chuck has at least four discharging elements.

A further embodiment of the invention provides a method for operating an electrostatic chuck. A wafer is placed on protrusions of the electrostatic chuck, which chuck includes an isolating substrate that surrounds at least one electrode and at least one discharging element positioned between the at least one electrode and upper portions of the multiple protrusions, and the chuck is operated in a chucking mode during which the at least one discharging element is placed at a floating electrical potential. The electrostatic chuck is also operated in a discharging mode in which the discharging element is coupled to a discharging circuit for discharging charge accumulated in the isolating substrate. Subsequently, the wafer is removed from the electrostatic chuck.

These and further embodiments of the invention are described in greater detail below.

BRIEF DESCRIPTION OF THE DRAWINGS

The subject matter regarded as the invention is particularly pointed out and distinctly claimed in the concluding portion of the specification. The invention, however, both as to organization and method of operation, together with objects, features, and advantages thereof, may best be understood by reference to the following detailed description when read with the accompanying drawings in which:

It will be appreciated that for simplicity and clarity of illustration, elements shown in the figures have not necessarily been drawn to scale. For example, the dimensions of some of the elements may be exaggerated relative to other elements for clarity. Further, where considered appropriate, reference numerals may be repeated among the figures to indicate corresponding or analogous elements.

DETAILED DESCRIPTION

In the following detailed description, numerous specific details are set forth in order to provide a thorough understanding of the invention. However, it will be understood by those skilled in the art that the present invention may be practiced without these specific details. In other instances, well-known methods, procedures, and components have not been described in detail so as not to obscure the present invention.

According to an embodiment of the invention, an electrostatic chuck includes an isolating substrate that has an upper surface and one or more discharging elements positioned above the upper surface (although they can be integrated with the isolating substrate and form the upper surface or a portion of the upper surface). The discharging elements can be connected to discharging circuits that may assist in discharging the isolating substrate and especially discharge charges that are proximate to upper surface. In a further embodiment, an electrostatic chuck includes an isolating substrate that surrounds at least one electrode; multiple protrusions having upper portions arranged to contact a wafer and at least one discharging element positioned between the at least one electrode and the upper portions of the multiple protrusions; wherein the at least one discharging element, once coupled to a discharging circuit, is arranged to discharge charge accumulated in the isolating substrate. Another embodiment of the invention provides a method for operating an electrostatic chuck that includes placing a wafer on protrusions of an electrostatic chuck, the electrostatic chuck comprising an isolating substrate that surrounds at least one electrode and at least one discharging element positioned between the at least one electrode and the upper portions of the multiple protrusions; operating the electrostatic chuck in a chucking mode during which the at least one discharging element is placed in a floating potential; operating the electrostatic chuck in a discharging mode in which the discharging element is coupled to a discharging circuit for discharging charge accumulated in the isolating substrate; and removing the wafer from the electrostatic chuck.

To enable chucking operation, the discharging elements should be electrically floating when operating in the chucking mode and be grounded (or otherwise be discharged) when operating in discharge mode.

According to various embodiments of the invention an electrostatic chuck is provided. It may include an isolating substrate that surrounds at least one electrode; multiple protrusions having upper portions arranged to contact a wafer; at least one discharging element (that may be positioned between the at least one electrode and the upper portions of the multiple protrusions). The at least one discharging element, once discharged by a discharging circuit, is arranged to discharge charges accumulated in the isolating substrate.

The electrostatic chuck may include the discharging circuit or may be connected to such a discharging circuit. The electrostatic chuck or the discharging circuit (or a conductor of the discharging circuit) may contact each other by using a mechanical movement such as changing a height of the electrostatic chuck or the conductor, rotating the conductor and the like.

The discharging circuit may include at least one switch that is arranged to disconnect the at least one discharging element from a ground when operating in a chucking mode and to ground the at least one discharging element when in a discharge mode. A switch can be allocated for each discharging element, although multiple discharging elements can be connected to the same switch.

The conductivity of the discharging element is selected to limit electrical discharges between the wafer and the electrostatic chuck. The electrical discharges are shorts and should not be fed by all the charges accumulated within the discharging element. Higher resistance per square unit values can limit the amount of charge within the discharging element that will participate in electrical discharges and can prevent the wafer from being damaged.

The conductivity can be selected as a tradeoff between limiting electrical discharge damages (higher resistance per square unit) and reducing discharging periods (lower resistance per square unit).

The conductivity of the discharging element can be within a range of 10 mega-ohms per square unit and 10 giga-ohms per square unit.

The conductivity of the discharging element can exceed 10 mega-ohms per square unit.

The conductivity of the discharging element can exceed 1 giga-ohms per square unit.

One or more discharging elements can be shaped as a sheet although other shapes can be provided. The thickness of the discharging elements can be on the order of a few microns but this is not necessarily so and the thickness can be less than a few microns, less than one micron or can exceed a few microns.

The number of discharging elements may exceed the number of electrodes.

The number of discharging elements may equal the number of electrodes.

The number of discharging elements may be less than the number of electrodes.

The electrostatic chuck may include a discharging element that is positioned in proximity to an edge of the isolating substrate.

The electrostatic chuck may include a discharging element that has an annular shape and is positioned in proximity to an edge of the isolating substrate.

The electrostatic chuck may include multiple electrodes and multiple discharging elements.

The shape of one discharging element may be the same as the shape of an electrode positioned below the discharging element.

The shape of each discharging element may be the same as the shape of each electrode positioned below the discharging element.

The shape and size of each discharging element may be the same as the shape and size of each electrode positioned below the discharging element.

The shape of each discharging element may be the same as the shape of each electrode positioned below the discharging element and the size of each discharging element may be larger than the size of each electrode that is located below the discharging element.

In some cases, neither of the discharging elements may be positioned over multiple electrodes.

Or, neither of the discharging elements may be positioned over multiple electrodes if the multiple electrodes are arranged to be set to different voltage levels.

A discharging element may be shaped as a grid.

The electrostatic chuck may include at least four discharging elements.

Figure 2:
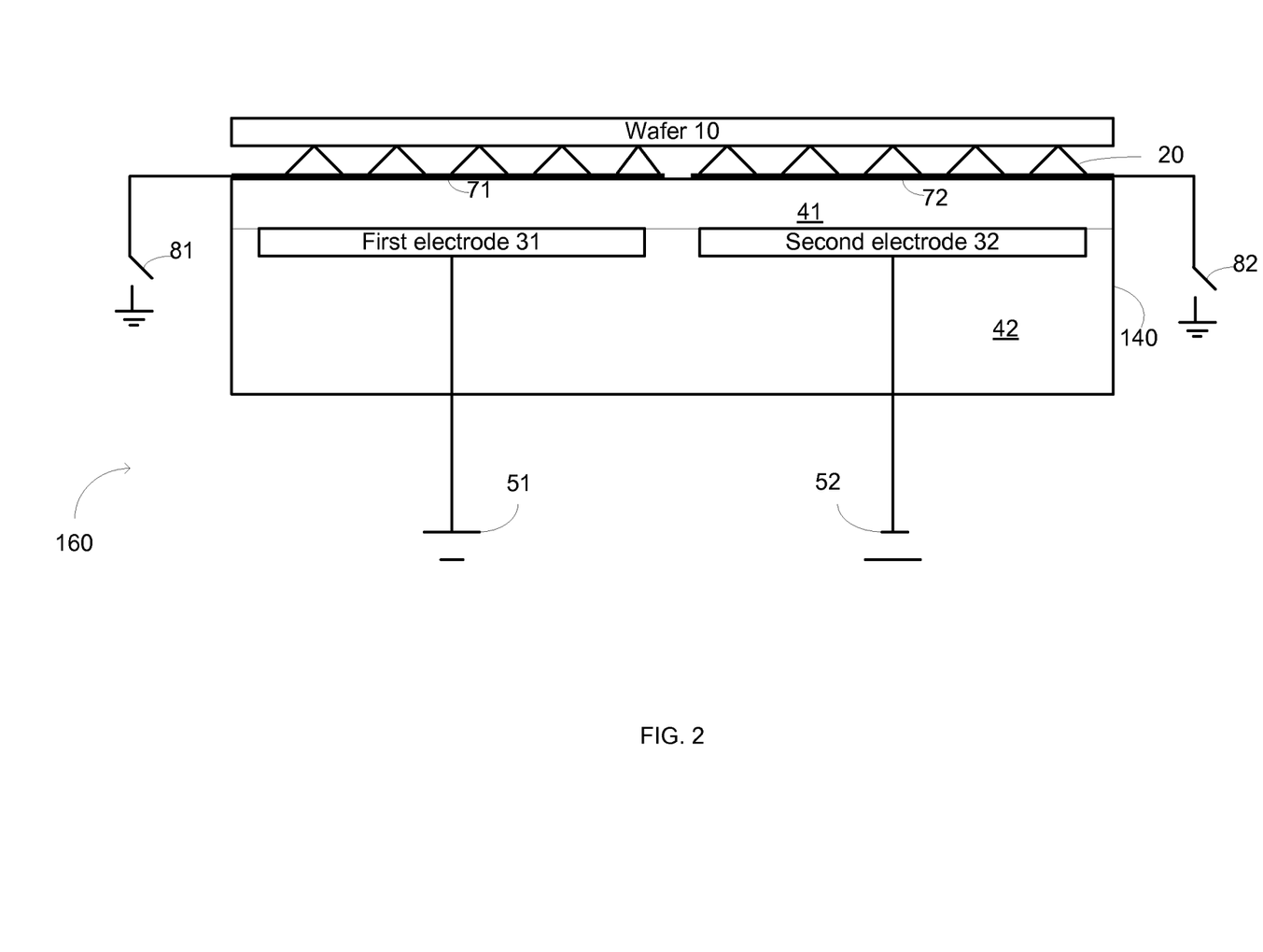
FIG. 2 is a cross sectional view of an electrostatic chuck according to an embodiment of the invention.

FIG. 2 is a cross sectional view of an electrostatic chuck 160 according to an embodiment of the invention.

The electrostatic chuck 160 of FIG. 2 differs from electrostatic chuck 60 by including two discharging elements 71 and 72 and two discharging circuits 81 and 82.

Discharging element 71 is positioned above first electrode 31 and is connected to discharging circuit 81. Discharging element 72 is positioned above second electrode 32 and is connected to discharging circuit 82.

Each discharging circuit 81, 82 is illustrated as including a switch that is connected between electrical ground and the discharging element. The switch is opened when operating in the chucking mode and is closed when operating in a discharging mode. The discharging mode may follow the chucking mode and be followed by removing the wafer 10 from the chuck 160.

It is noted that an unloading of a wafer can be followed by operating the electrostatic chuck in a discharging mode to discharge charge introduced by the unloading of the wafer.

FIG. 2 illustrates the discharging element 71 as "covering" the entire electrode 31 and illustrates the discharging element 72 as "covering" the entire electrode 32.

Figure 3:
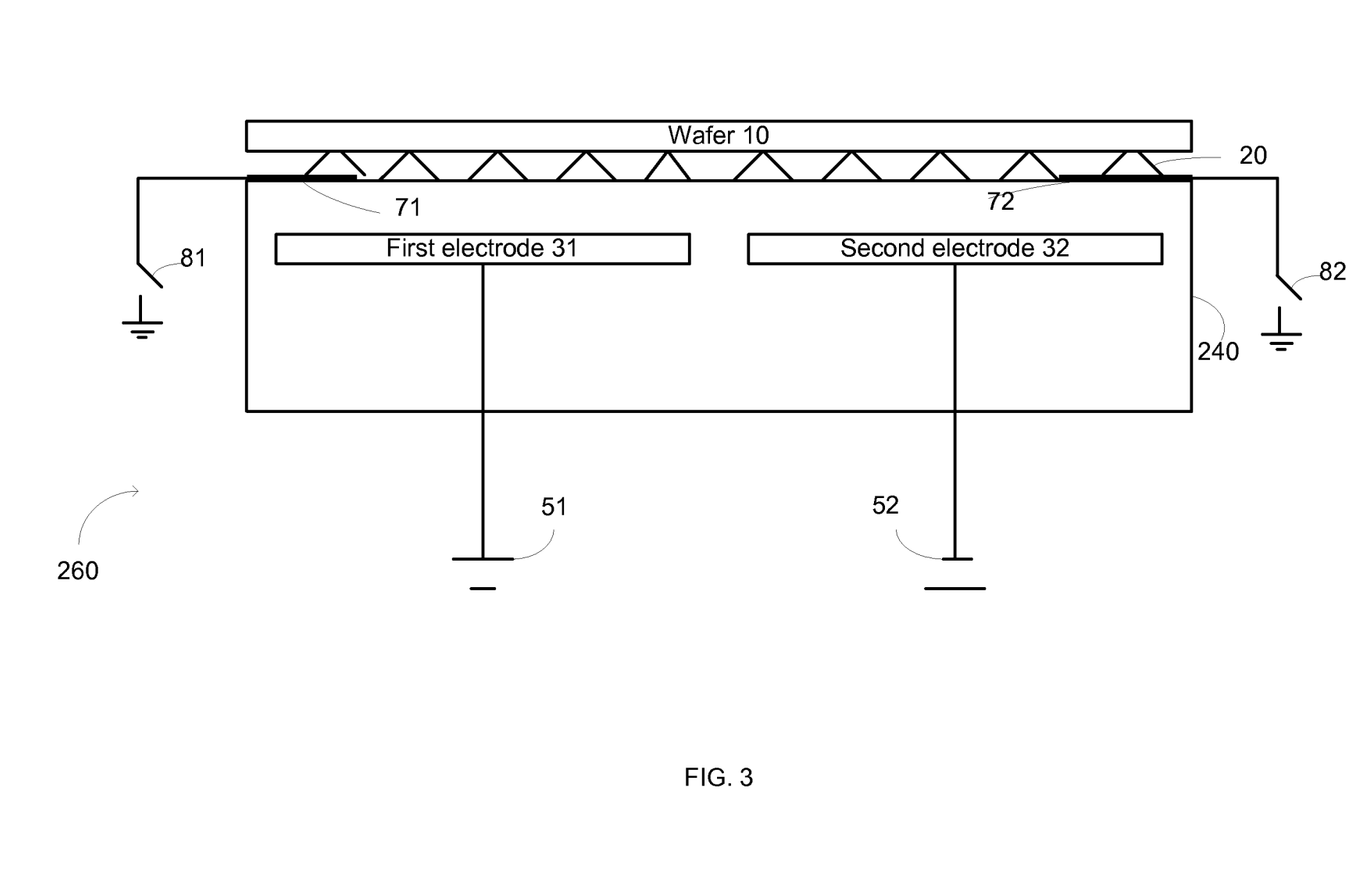
FIG. 3 is a cross sectional view of an electrostatic chuck according to an embodiment of the invention.

FIG. 3 is a cross sectional view of an electrostatic chuck 260 according to an embodiment of the invention.

The electrostatic chuck 260 of FIG. 3 differs from electrostatic chuck 160 of FIG. 2 by including two discharging elements 71 and 72 that are proximate to the edge of the insulating substrate 240 and "cover" only a small portion of a respective electrode 31, 32. Each of discharging elements 71 and 72 can have a half-ring shape.

Figure 4:
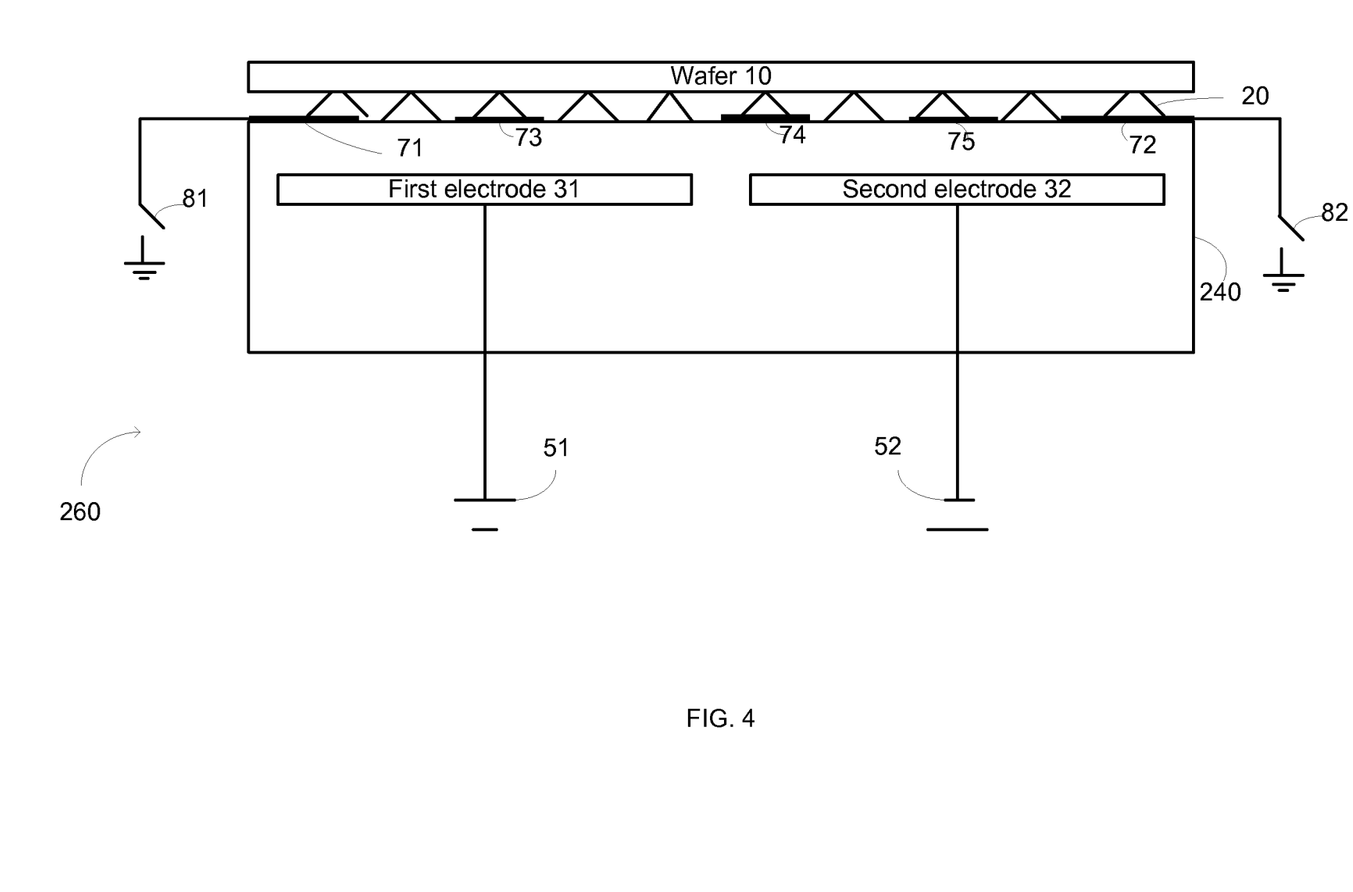
FIG. 4 is a cross sectional view of an electrostatic chuck according to an embodiment of the invention.

FIG. 4 is a cross sectional view of an electrostatic chuck 260 according to an embodiment of the invention.

The electrostatic chuck 360 of FIG. 4 differs from electrostatic chuck 160 of FIG. 2 by including five discharging elements 71-75, each "covers" only a small portion of a respective electrode 31, 32.

Each of the discharging elements 71 and 72 can have a half-ring shape. The different discharging elements can be isolated from each other although one or more can be connected to each other. It is noted that the number of discharging elements can differ from two or five. It can, for example, exceed five.

Figure 5:
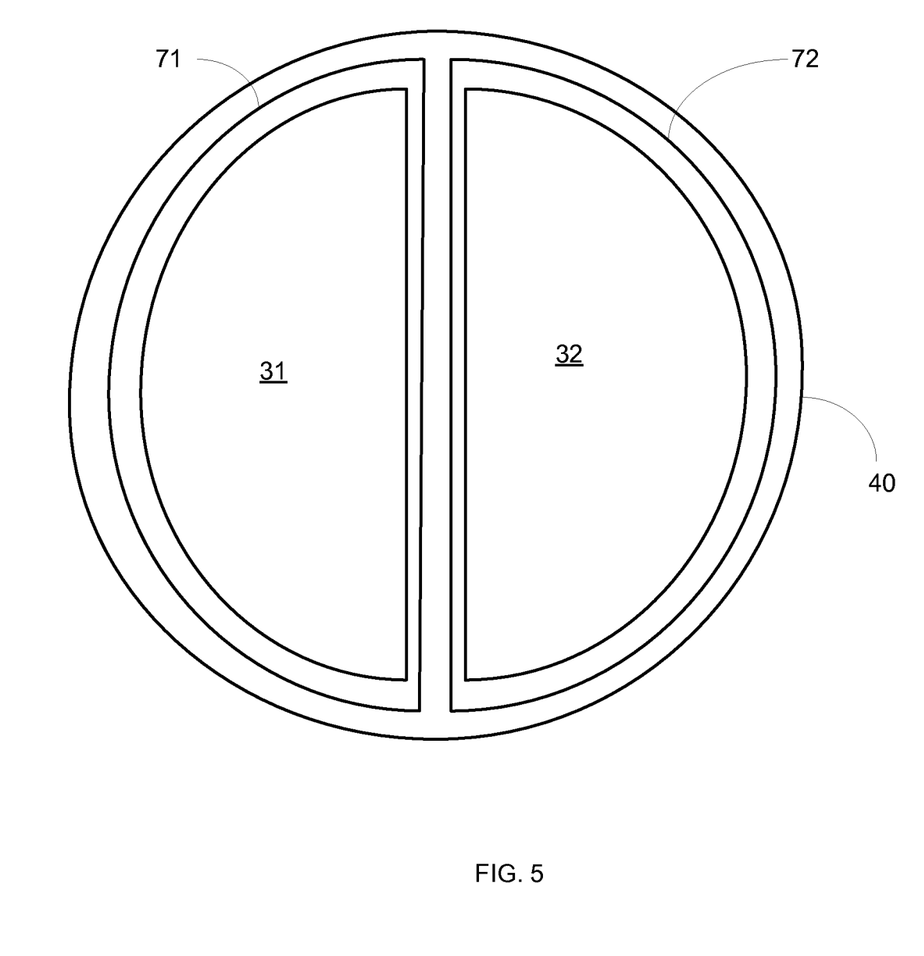
FIG. 5 is a top view of half-circle shaped discharging elements of a circular isolating substrate and of half-circle shaped electrodes according to an embodiment of the invention.

FIG. 5 is a top view of half-circle shaped discharging elements 71 and 72, of circular isolating substrate 40 and of half-circle shaped electrodes 31 and 32 according to an embodiment of the invention.

FIG. 5 illustrates discharging elements 71 and 72 as being slightly bigger than half-circle shaped electrodes 31 and 32.

Figure 6:
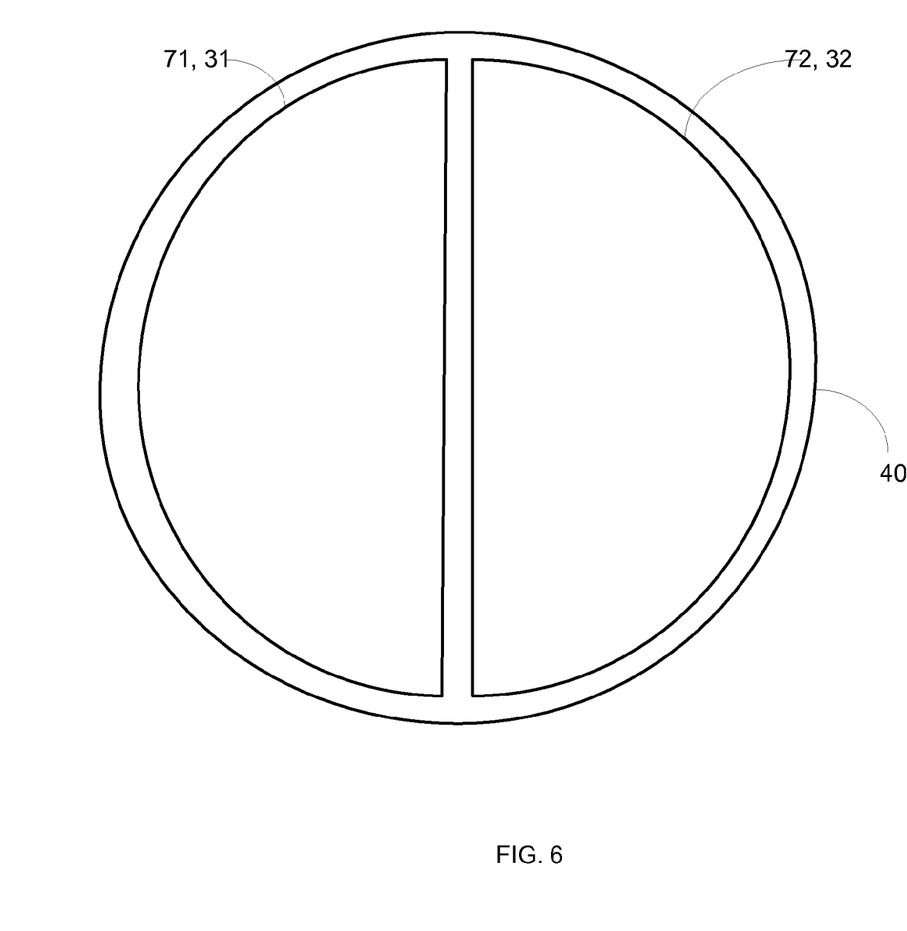
FIG. 6 is a top view of half-circle shaped discharging elements of a circular isolating substrate and of half-circle shaped electrodes according to an embodiment of the invention.

FIG. 6 is a top view of half-circle shaped discharging elements 71 and 72, of circular isolating substrate 40 and of half-circle shaped electrodes 31 and 32 according to an embodiment of the invention.

FIG. 6 illustrates discharging elements 71 and 72 as being of the same size and shape as the half-circle shaped electrodes 31 and 32.

Figure 7:
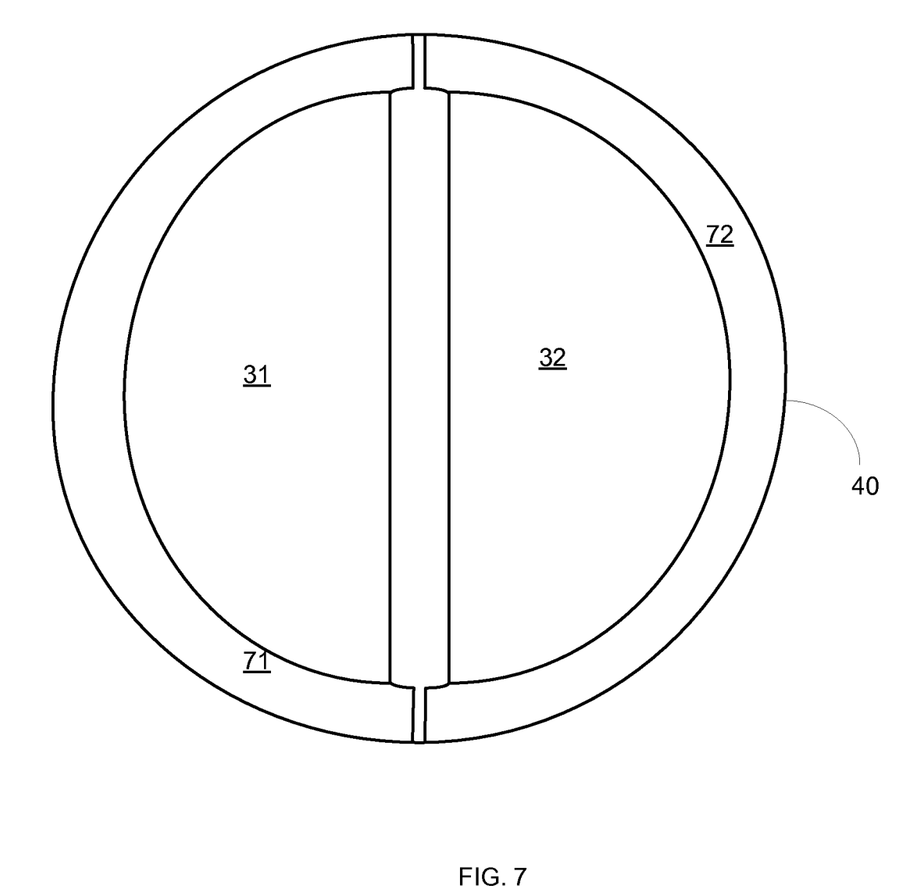
FIG. 7 is a top view of half-ring shaped discharging elements of a circular isolating substrate and of half-circle shaped electrodes according to an embodiment of the invention.

FIG. 7 is a top view of half-ring shaped discharging elements 71 and 72, of circular isolating substrate 40 and of half-circle shaped electrodes 31 and 32 according to an embodiment of the invention.

FIG. 7 illustrates half-ring shaped discharging elements 71 and 72 as being located in proximity to the edge of the isolating substrate 40.

Figure 8:
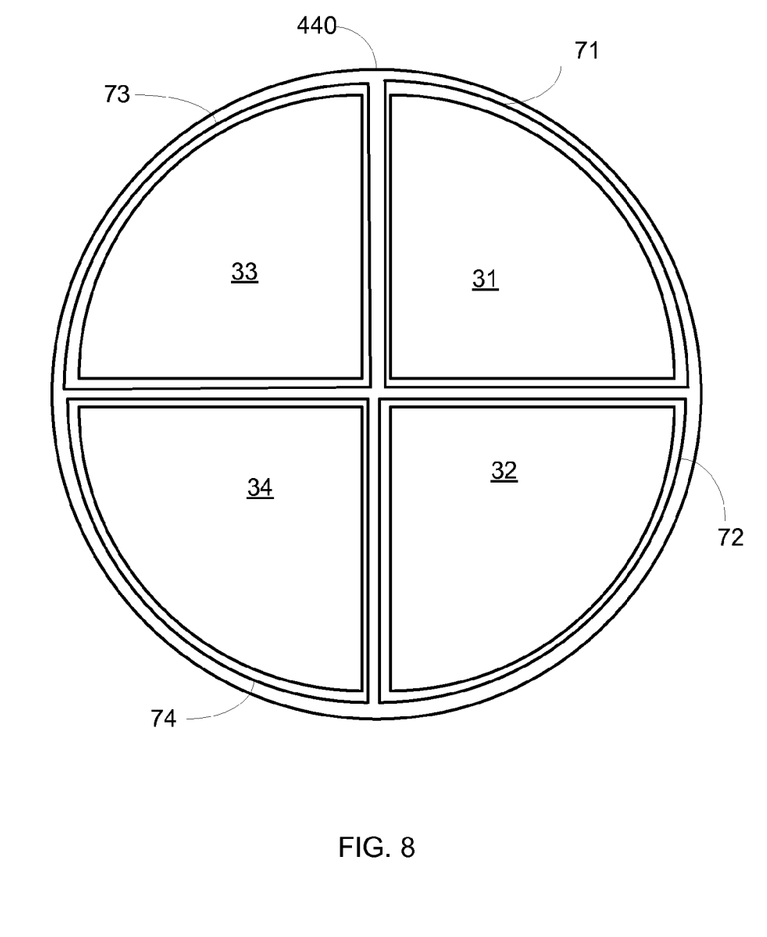
FIG. 8 is a top view of one fourth circle shaped discharging elements of a circular isolating substrate and of one fourth circle shaped electrodes according to an embodiment of the invention.

FIG. 8 is a top view of one fourth circle shaped discharging elements 71 and 72, of circular isolating substrate 40 and of one fourth circle shaped electrodes 31 and 32 according to an embodiment of the invention.

FIG. 8 illustrates the one-fourth circle shaped discharging elements 71 and 72 as being slightly bigger than the one fourth circle shaped electrodes 31 and 32.

Figure 9:
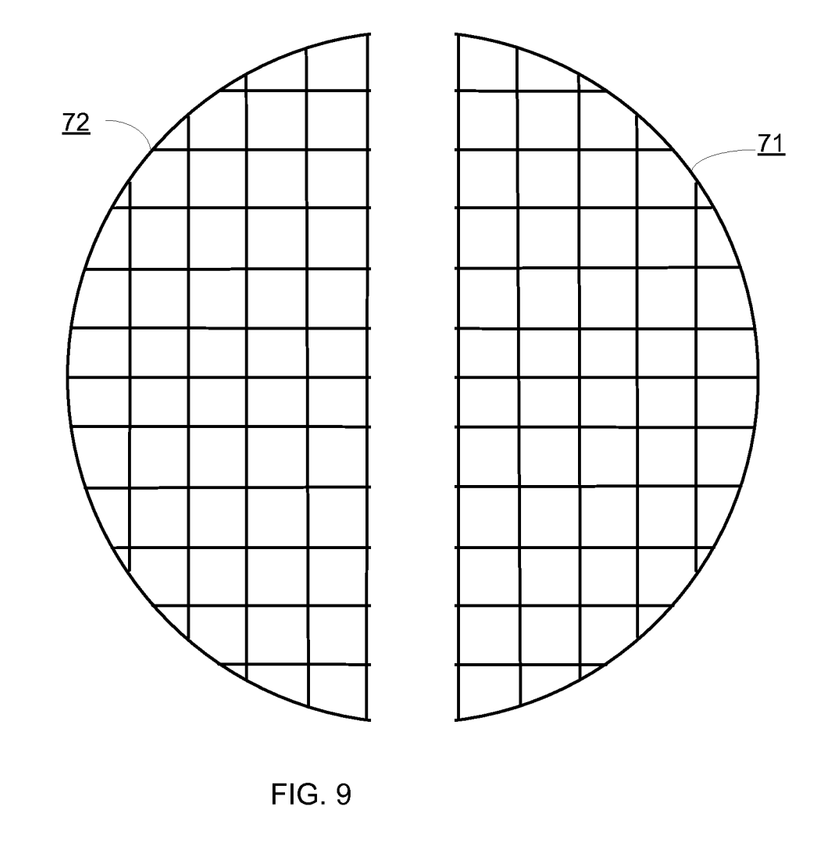
FIG. 9 is a top view of two grid-shaped discharging elements according to an embodiment of the invention.

FIG. 9 is a top view of two grid shaped discharging elements 71 and 72 according to an embodiment of the invention.

It is noted that the shape of one discharging element can be different than the shape of another discharging element.

It is noted that a size of one discharging element can be different than the size of another discharging element.

It is further noted that the protrusions can be made of the same material as the discharging elements but this is not necessarily so and they can be made from another material such as diamond grade coating.

A method may be provided and may be executed by the above-described electrostatic chucks.

The method may include: (i) providing any of the above-mentioned electrostatic chucks; (ii) placing a wafer on the electrostatic chuck; (iii) operating in a chucking mode by supplying voltage to each electrode of the chuck and allowing the discharging elements to electrically float; (iv) operating in a discharging mode by grounding the discharging elements of the chuck, thus discharging charges accumulated in the insolating substrate via the at least one discharging element and the at least one discharging circuit; and (v) removing the wafer from the electrostatic chuck.

Figure 10:
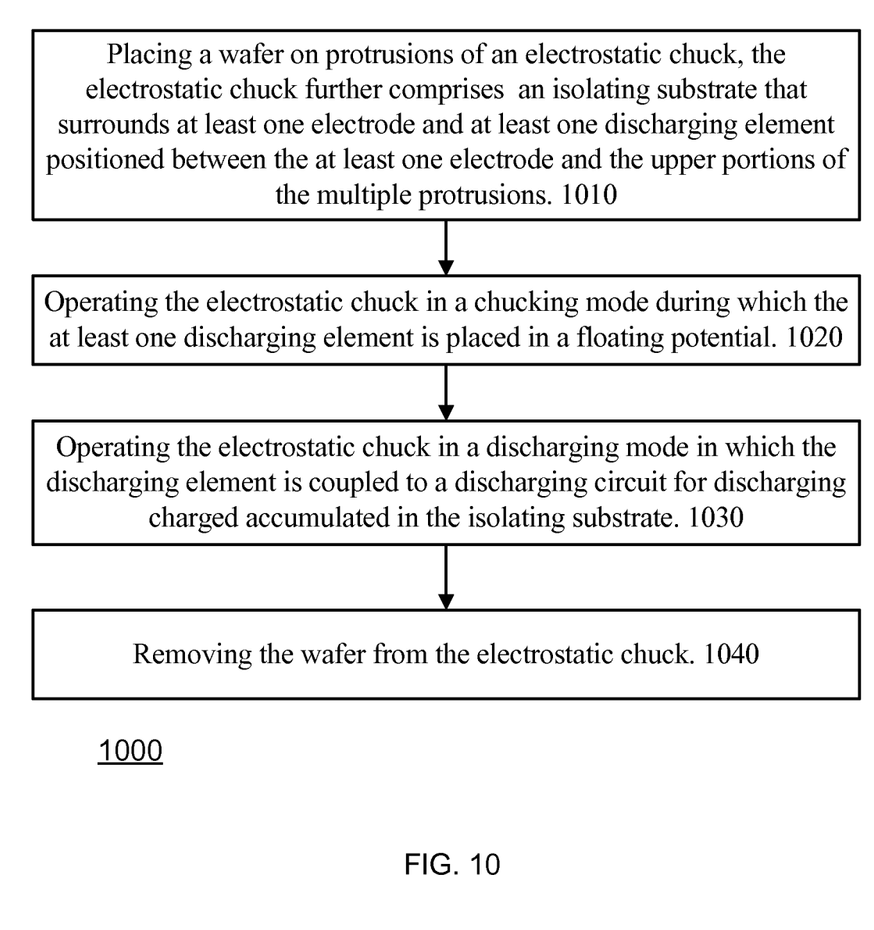
FIG. 10 illustrates a method according to an embodiment of the invention.

FIG. 10 illustrates method 1000 according to an embodiment of the invention.

Method 1000 starts at 1010 with placing a wafer on protrusions of an electrostatic chuck, the electrostatic chuck may comprise an isolating substrate that surrounds at least one electrode and at least one discharging element positioned between the at least one electrode and the upper portions of the multiple protrusions. As indicated above, the electrostatic chuck can be any of the above-described electrostatic chucks.

Step 1010 is followed by 1020, operating the electrostatic chuck in a chucking mode during which the at least one discharging element is allowed to float in electric potential.

Step 1020 is followed by 1030, operating the electrostatic chuck in a discharging mode in which the discharging element is coupled to a discharging circuit (e.g., one that is coupled to electrical ground) for discharging charge accumulated in the isolating substrate.

Step 1030 is followed by 1040, removal of the wafer from the electrostatic chuck.

Step 1040 can be followed by either of steps 1020 or 1030.

It is noted that all discharging elements may be grounded during each discharging period or only a few of the discharging elements of a chuck can be so grounded.

It is noted that grounding of discharge elements can include coupling the discharge element to another potential (including a positive potential, or a negative potential).

While certain features of the invention have been illustrated and described herein, many modifications, substitutions, changes, and equivalents will now occur to those of ordinary skill in the art. It is, therefore, to be understood that the appended claims are intended to cover all such modifications and changes as fall within the true spirit of the invention.

What is claimed is:

1. An electrostatic chuck, comprising:
    an isolating substrate that surrounds multiple electrodes;
    multiple protrusions having upper portions arranged to contact a wafer;
    multiple discharging elements each positioned between one of the multiple electrodes and the upper portions of the multiple protrusions;
    wherein the multiple discharging elements are arranged to discharge charge accumulated in the isolating substrate.

2. The electrostatic chuck according to claim 1, further comprising a discharging circuit coupled to the multiple discharging elements for discharging the charge accumulated in the isolating substrate.

3. The electrostatic chuck according to claim 2, wherein the discharging circuit comprises at least one switch that is arranged to disconnect the multiple discharging elements from an electrical ground when operating in a chucking mode and to connect the multiple discharging elements to ground when operating in a discharge mode.

4. The electrostatic chuck according to claim 1, wherein a conductivity of the multiple discharging elements is selected to limit electrical discharges between the wafer and the electrostatic chuck.

5. The electrostatic chuck according to claim 1, wherein a conductivity of the multiple discharging elements is within a range of 10 mega-ohms per square unit and 10 giga-ohms per square unit.

6. The electrostatic chuck according to claim 1, wherein a conductivity of the multiple discharging elements exceeds 10 mega-ohms per square unit.

7. The electrostatic chuck according to claim 1, wherein a conductivity of the multiple discharging elements exceeds 1 giga-ohms per square unit.

8. The electrostatic chuck according to claim 1, wherein the multiple discharging elements are sheets.

9. The electrostatic chuck according to claim 1, wherein the electrostatic chuck includes a greater number of the multiple discharging elements than a number of the multiple electrodes.

10. The electrostatic chuck according to claim 1, wherein the electrostatic chuck includes an equal number of the multiple discharging elements and the multiple electrodes.

11. The electrostatic chuck according to claim 1, wherein the electrostatic chuck includes a fewer number of the multiple discharging elements than a number of the multiple electrodes.

12. The electrostatic chuck according to claim 1, wherein at least one of the multiple discharging elements is positioned in proximity to an edge of the isolating substrate.

13. The electrostatic chuck according to claim 1, wherein at least one of the multiple discharging elements has an annular shape and is positioned in proximity to an edge of the isolating substrate.

14. The electrostatic chuck according to claim 1, wherein a shape of at least one of the multiple discharging elements is a same shape as one of the multiple electrodes that is positioned below the discharging element.

15. The electrostatic chuck according to claim 1, wherein a shape of each of the multiple discharging elements is a same shape as the multiple electrodes that are positioned below the multiple discharging elements.

16. The electrostatic chuck according to claim 1, wherein a shape and size of each of the multiple discharging elements is a same shape and size as the multiple electrodes that are positioned below the multiple discharging elements.

17. The electrostatic chuck according to claim 1, wherein a shape of each of the multiple discharging elements is a same shape as one of the multiple electrodes that is positioned below the discharging element and a size of each of the multiple discharging elements is larger than a size of each electrode the electrode that is that is located below the respective discharging element.

18. The electrostatic chuck according to claim 1, wherein none of the multiple discharging elements are positioned over a plurality of the multiple electrodes that are arranged to be set to different voltage levels.

19. The electrostatic chuck according to claim 1, wherein at least one of the multiple discharging elements is shaped as a grid.

20. A method for operating an electrostatic chuck, the method comprising:
    placing a wafer on protrusions of an electrostatic chuck, the electrostatic chuck including an isolating substrate that surrounds at least one electrode and at least one discharging element that extends along an upper surface of the isolating substrate and under at least a portion of the multiple protrusions;
    operating the electrostatic chuck in a chucking mode during which that at least one discharging element is placed at a floating electrical potential;
    operating the electrostatic chuck in a discharging mode in which the discharging element is coupled to a discharging circuit for discharging charge accumulated in the isolating substrate; and
    removing the wafer from the electrostatic chuck.

21. The electrostatic chuck according to claim 1, further comprising discharging circuits, each coupled to one of the multiple discharging elements, for discharging the charge accumulated in the isolating substrate.

* * * * *